United States Patent [19]
Guenther, Jr. et al.

[11] Patent Number: 6,097,755
[45] Date of Patent: Aug. 1, 2000

[54] TIME DOMAIN REFLECTOMETER HAVING OPTIMAL INTERROGATING PULSES

[75] Inventors: Edgar T. Guenther, Jr.; Stanley C. Edwards, both of Bend, Oreg.

[73] Assignee: Tektronix, Inc., Beaverton, Oreg.

[21] Appl. No.: 08/954,382

[22] Filed: Oct. 20, 1997

[51] Int. Cl.[7] .............................. H04B 17/00; H04B 3/46; H04Q 1/20

[52] U.S. Cl. ............................................ 375/228; 375/224

[58] Field of Search ...................................... 375/224, 228; 455/67.4, 423; 327/100, 164, 307; 333/20; 379/6, 24, 26, 30

[56] References Cited

U.S. PATENT DOCUMENTS

| | | | |
|---|---|---|---|
| 4,634,964 | 1/1987 | Chattler | 324/628 |
| 5,038,364 | 8/1991 | Motoori | 375/213 |
| 5,144,525 | 9/1992 | Saxe et al. | 365/45 |
| 5,233,986 | 8/1993 | Robson | 607/28 |
| 5,251,622 | 10/1993 | Robson | 607/19 |
| 5,361,776 | 11/1994 | Samuelson et al. | 128/734 |

OTHER PUBLICATIONS

Tektronix User Manual TS100 TelScout Metallic Time–Domain Reflectometer 070–8778–05.

Tektronix User Manual TV110 CableScout Metallic Time–Domain Reflectometer 070–8981–00.

*Primary Examiner*—Don N. Vo
*Assistant Examiner*—Phuong Phu
*Attorney, Agent, or Firm*—William K. Bucher

[57] ABSTRACT

An improved pulse generator circuit includes a pulse shaper circuit for generating interrogating bipolar pulse having reduced or no energy at zero frequency for use in a measurement test instrument for characterizing a transmission medium, such a twisted pair and coaxial transmission cables.

21 Claims, 8 Drawing Sheets

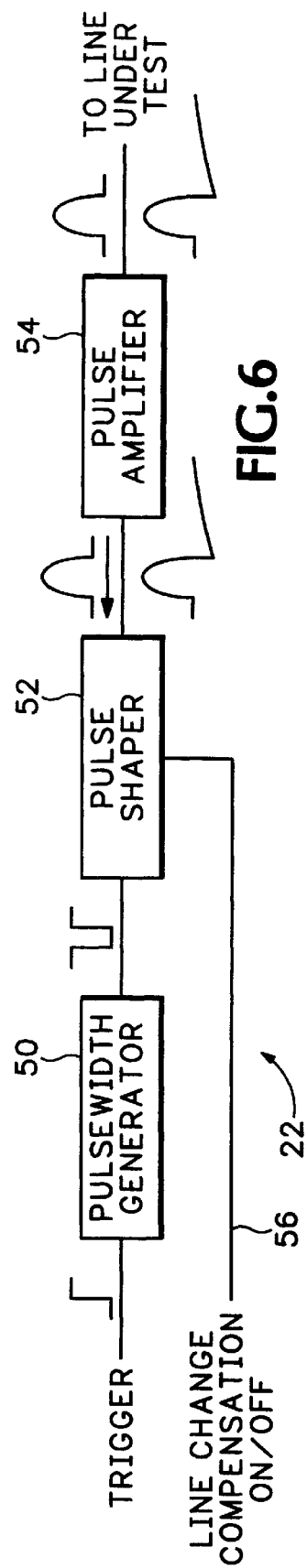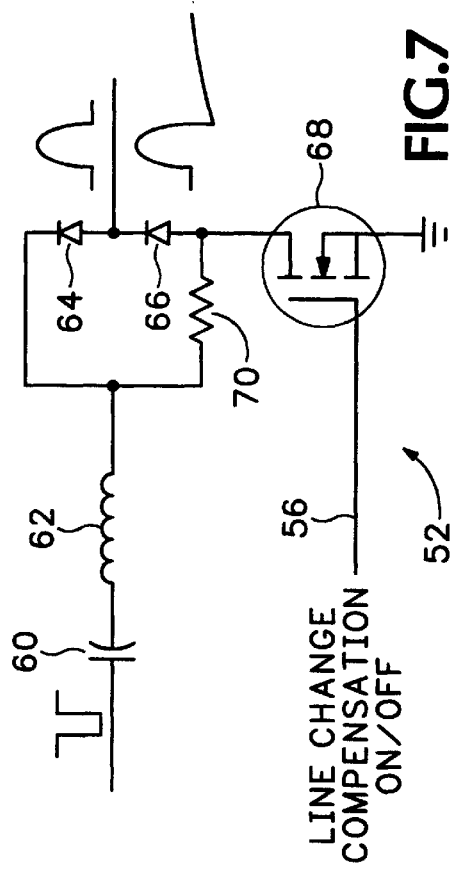
FIG. 6
FIG. 7

TIME DOMAIN REFLECTOMETER HAVING OPTIMAL INTERROGATING PULSES

BACKGROUND OF THE INVENTION

The present invention relates generally to measurement test instruments for characterizing a transmission medium and more particularly to an improved time domain reflectometer and method for reducing line charge in the transmission medium during characterization.

A time domain reflectometer (TDR) launches interrogating energy pulses into a transmission medium, such as shielded and unshielded twisted pairs, coaxial cables, and the like, at a given pulse repetition rate, depending upon the designated range of the TDR. During the periods between pulses, acquisition circuitry samples the cable to acquire data representative of reflections from flaws, discontinuities, or breaks in the cable. The reflections in the cable are timed from the time of transmission of the energy pulse to determine the range from the transmitter to such flaws, discontinuities, or breaks. Reflections may represent changes in wire gauge, splices, moisture in the cable, and the like. The acquired data is processed and displayed as a waveform trace on a display device, such as a cathode-ray-tube, a liquid crystal display, or the like.

A TDR notes any changes in the characteristic impedance of the cable under test. For a telecommunications copper facility or plant, the characteristic impedance is typically between 100 and 125 ohms. Most unshielded cables fall between 100 and 105 ohms. Shielded cable like T1 is typically about 125 ohms. Any change in the cable's impedance is displayed on the TDR display device as an upward bump, downward dip, or some combination of both deviating from a horizontal trace.

The TS100 and the TV110 Time Domain Reflectometers, manufactured and sold by Tektronix, Inc., Wilsonville, Oreg. and assignee of the instant invention, are examples of TDRs for respectively characterizing telephone twisted pair cables and coaxial cable, such as in CATV and the like. Both instruments generate ½ Sine interrogating energy pulses, such as shown in FIG. 1. The amplitude and pulsewidth of the applied interrogating pulses are varied as a function of a number of factors, such as cable type, cable length, and the like. The TS100 generates interrogating pulses having a maximum amplitude of up to 20 volts and pulsewidths from 5 nsec to 300 nsec. The TV110 generates interrogating pulses having a maximum amplitude of 15 volts and pulses widths of 6 nsec and 12 nsec. To extend the range of the TDR requires increasing the energy of the applied pulse in order to increase the amount of energy reflected from an event. This can be done by increasing the amplitude of the launched pulse, increasing the pulsewidth, or a combination of both. Increasing the energy launched into the cable under test has the undesirable effect of placing a charge on the transmission line being tested which may mask or obscure the reflective information close to the instrument. FIG. 2 shows overlain waveform traces, A and B, of return signals acquired using the ½ Sine waveform of FIG. 1 launched into 15,000 feet of 24 gauge twisted pair transmission line. The interrogating pulse produces a high amplitude reflective pulse 10 at the instrument/cable under test interface. Due to line charging, the interface reflective pulse decays exponentially as shown by the region 12. Events within the line charge region, such as the short in waveform trace A at 14 and the open in waveform trace B at 16, may be masked or obscured by the line charging. In the waveform traces of FIG. 2, the scale has been increased to show the existence of the shorted and open events. In general use, the TDR vertical scale is adjusted to show the complete waveform events without clipping the tops or bottoms of events. This would generally obscure events within the line charge region.

What is needed is a measurement test instrument, such as a time domain reflectometer, and method for reducing the line charge placed on a transmission medium, such as a twisted pair lines and coaxial cables, by interrogating energy pulses. The measurement test instrument should provide increased viewability and interpretation of waveform data representing the return reflections in the transmission cable, particularly when the return reflections are small in amplitude and instrument amplifier gain is large to adequately view the reflections.

SUMMARY OF THE INVENTION

Accordingly, the present invention is directed to an improved pulse generator circuit for use in a measurement test instrument, such a a time domain reflectometer, for characterizing impedance in a transmission medium by launching interrogating pulses into the transmission medium for acquiring data representative of return reflections from the transmission medium. The improved pulse generator includes a pulse shaper circuit receiving an input signal for generating a bipolar output signal having minimal energy at zero frequency for producing interrogating pulses having reduced line charging effects on the transmission medium. The unique pulse shaper circuit has a resonant LC circuit receiving an input pulse having a leading transition and a trailing transition for generating a sine wave current output having a positive magnitude one-half sine portion and a negative magnitude one-half sine portion. A diode-resistor network is coupled to the resonant LC circuit for clamping the magnitude of one of the one-half sine wave portions for producing a exponentially decreasing output portion resulting in the bipolar interrogating energy pulse having a one-sine magnitude portion and a exponentially decreasing output portion. In the preferred embodiment of the invention the diode-resistor network clamps the bipolar current output magnitudes at a ratio of three-to-one. The pulse shaper circuit in the improved pulse generator circuit may also include a means coupled to the diode-resistor network for applying a ground to the pulse shaper circuit during unipolar operation and removing the ground during bipolar operation where the grounding means is an electronic switch. In the preferred embodiment the electronic switch is a field-effect transistor having a drain coupled to the diode-resistor network, a source coupled to ground, and a gate coupled to receive an input signal for causing the field-effect-transistor to conduct and couple the diode-resistor network to ground.

The pulse generator circuit as may be used in a time domain reflectometer type measurement test instrument includes a pulsewidth generator for generating an output pulse having a leading transition and a trailing transition. The pulse shaper circuit receives the output pulse from the pulsewidth generator for generating a bipolar output signal having minimal energy at zero frequency for producing interrogating pulses having reduced line charging effects on the transmission medium. An amplifier is coupled to receive the output from the pulse shaper circuit for generating an amplified output signal for launching into the transmission medium. In the preferred embodiment of the invention, the pulsewidth generator circuit includes a latch for generating an output pulse having a leading transition generated in response to a pulsewidth enable signal and a clock input signal and a trailing transition generated in response to a clear input signal. A comparator circuit having a first input coupled to receive a threshold value and a second input coupled to receive an input signal responsive to the leading transition of the latch output generates the clear input signal to the latch when the input signal to the comparator exceeds the threshold value. An RC circuit is coupled to the second input of the comparator circuit for generating an increasing voltage signal in response to the leading transition of the latch output.

In a further embodiment of the improved pulse generator circuit, a plurality of latches are provided with each latch receiving individual pulsewidth enable signals for generating individual output pulses in response to a common clock signal. A logic circuit receives the outputs from the plurality of latches for generating an output signal in response to a leading edge transition from any of the latches. A plurality of RC circuits are coupled to the second input of the comparator circuit for generating an increasing voltage signal in response to the output signal from the logic circuit with each RC circuit having a time constant defining a pulsewidth for a particular latch. Means are provided for enabling each of the respective RC circuits in response to the individual pulsewidth enable signals. A plurality of pulse shaper circuits are coupled to receive the output pulses from the pulsewidth generator circuit with each pulse shaper circuit receiving the output pulse from the one of the plurality of latches.

A further embodiment of the present invention is an improved measurement test instrument and method for characterizing impedance in a transmission medium by launching interrogating pulses into the transmission medium for acquiring data representative of return reflections from the transmission medium. The transmission medium may be shielded and unshielded twisted pair cables, coaxial cables, and the like. The improved measurement test instrument includes a pulse generator for generating bipolar interrogating pulses having nominal energy at zero frequency for reducing line charge produced by the launched interrogating pulse. The pulse generator further includes a variable pulse generator for generating interrogating pulses having amplitudes and pulsewidths optimized for viewing parameters using unipolar pulses for shorter transmission cable lengths and the bipolar pulses for the longer transmission cables lengths. The measurement test instrument has a means for displaying the acquired data representative of the return reflections from the transmission cable.

The improved method for characterizing impedance in a transmission medium by launching interrogating pulses into the transmission medium for acquiring and displaying data representative of return reflections from the transmission medium includes the improvement step of generating interrogating bipolar pulses having nominal energy at zero frequency for reducing line charge produced by the launched interrogating pulses. The improved generating step further includes the steps of generating interrogating pulses having amplitudes and pulsewidths optimized for viewing parameters using unipolar pulses for shorter transmission medium lengths and generating interrogating pulses having amplitudes and pulsewidths optimized for viewing parameters using the bipolar pulses for the longer transmission medium lengths. The objects, advantages and novel features of the present invention are apparent from the following detailed description when read in conjunction with the appended claims and attached drawings.

BRIEF DESCRIPTION OF THE DRAWINGS

FIG. 6 is a block diagram of the improved pulse generator for generating bipolar interrogating pulses according to the present invention.

FIG. 7 is a representative schematic diagram of the pulse shaper circuit in the improved pulse generator for generating bipolar interrogating pulses according to the present invention.

DETAIL DESCRIPTION OF THE PREFERRED EMBODIMENT

Figure 1:
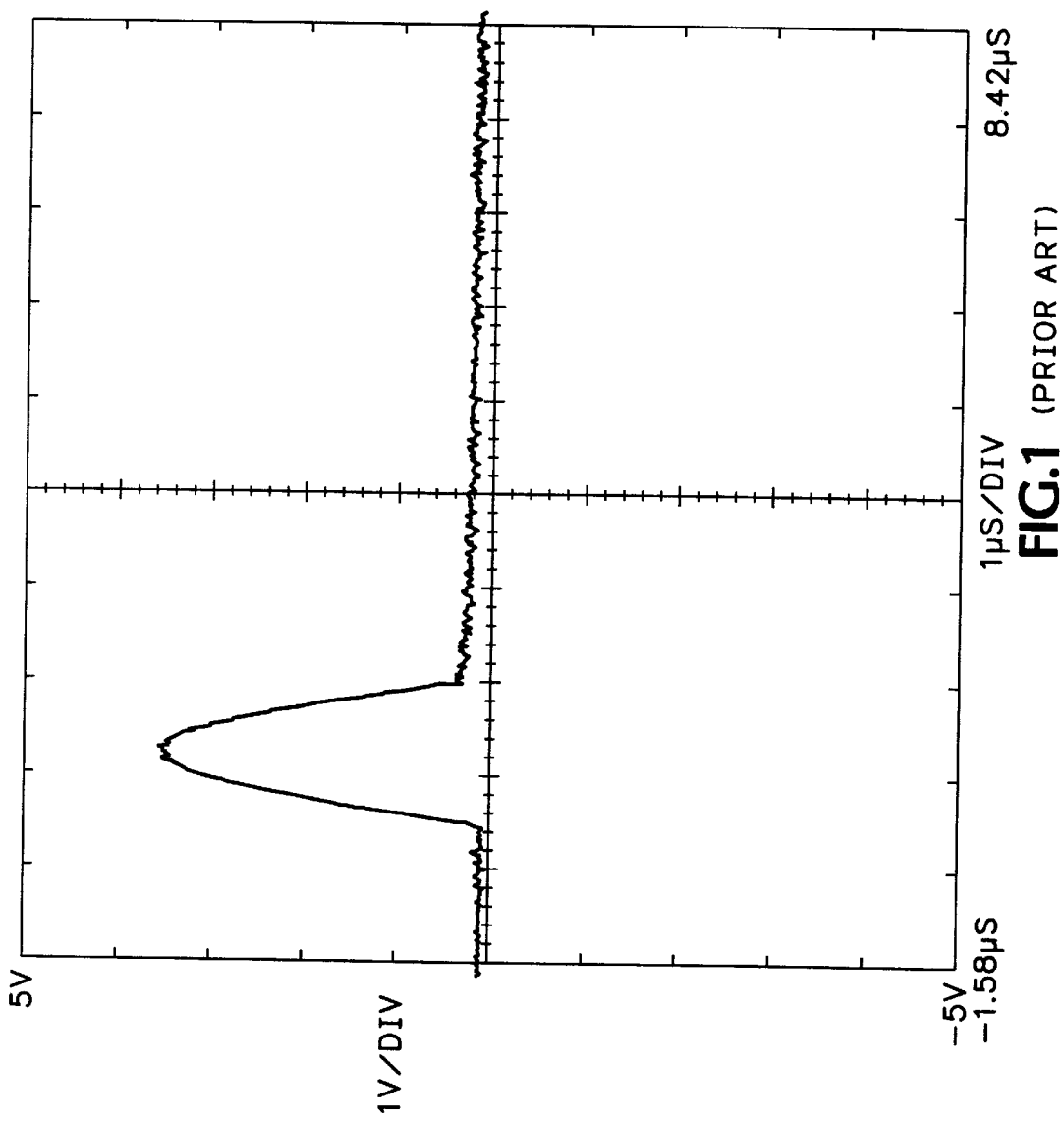
FIG. 1 is a waveform trace of a ½ Sine interrogating energy pulse generated by existing time domain reflectometers for characterizing impedance in a transmission medium.

Line charging is an artifact of applying an electrical signal into a conductive transmission medium, such a twisted pair cables, coaxial cables, and the like, with the line charging linearly increases and decreases as a function of the applied signal power. In time domain reflectometry where interrogating electrical pulses are launched into a transmission medium under test for acquiring data representative of the impedance of the transmission medium for characterizing events in the cable, line charging causes masking of small impedance changes in the transmission medium in the region near the test instrument. Decreasing the energy input to the transmission medium to reduce line charging causes a corresponding reduction in any reflected signal event. Increasing the gain of the TDR receiver to compensate for the reduced energy input results in amplifying both the line charge and the reflected signal event again resulting in masking small signal events in the line charge region. The instant invention overcomes the line charging problem by incorporating an improved pulse generator that generates bipolar interrogating pulses having reduced or no energy at zero frequency.

The time domain reflectometer incorporating the present invention characterizes impedances in both short and long transmission mediums. It is envisioned that unipolar interrogating energy pulses having a peak-to-peak magnitude of 10 volts and pulsewidths of 3 nsec, 10 nsec, and 50 nsec will be used for characterizing short transmission medium cables under 2 km. Bipolar interrogating energy pulses having a peak-to-peak magnitude of 20 volts and pulsewidths of 340 nsec and 3400 nsec are envisioned for long transmission medium cables of greater than 2 km. The listed length of the short and long transmission mediums are only exemplary and other lengths may be defined for these lengths. The length of the cable as defined here is related to the amount of energy launched into the cable and the line charging effects caused by the interrogating pulses. The lower the magnitude and the narrower the pulsewidth of the interrogating pulses generates less energy for launching into the transmission medium. Correspondingly, with less electrical energy being launched into the transmission medium, the lower the line charging effects. However, less energy launched into the transmission medium limits the range over which the cable can be characterized. The range over which the unipolar pulses can characterize a cable having the above magnitude and pulsewidths is estimated at 2 km. Hence, shorter pulsewidth, lower magnitude interrogating energy pulses will be used for short cables. Extending the range of the TDR for longer cable lengths requires injecting more energy into the cable under test. This results in line charging for which the bipolar energy pulses are used. The values listed above are representative in nature and other peak-to-peak magnitude values and pulsewidths may be used for both the unipolar and bipolar pulses without departing from the scope of the invention.

Figure 3:
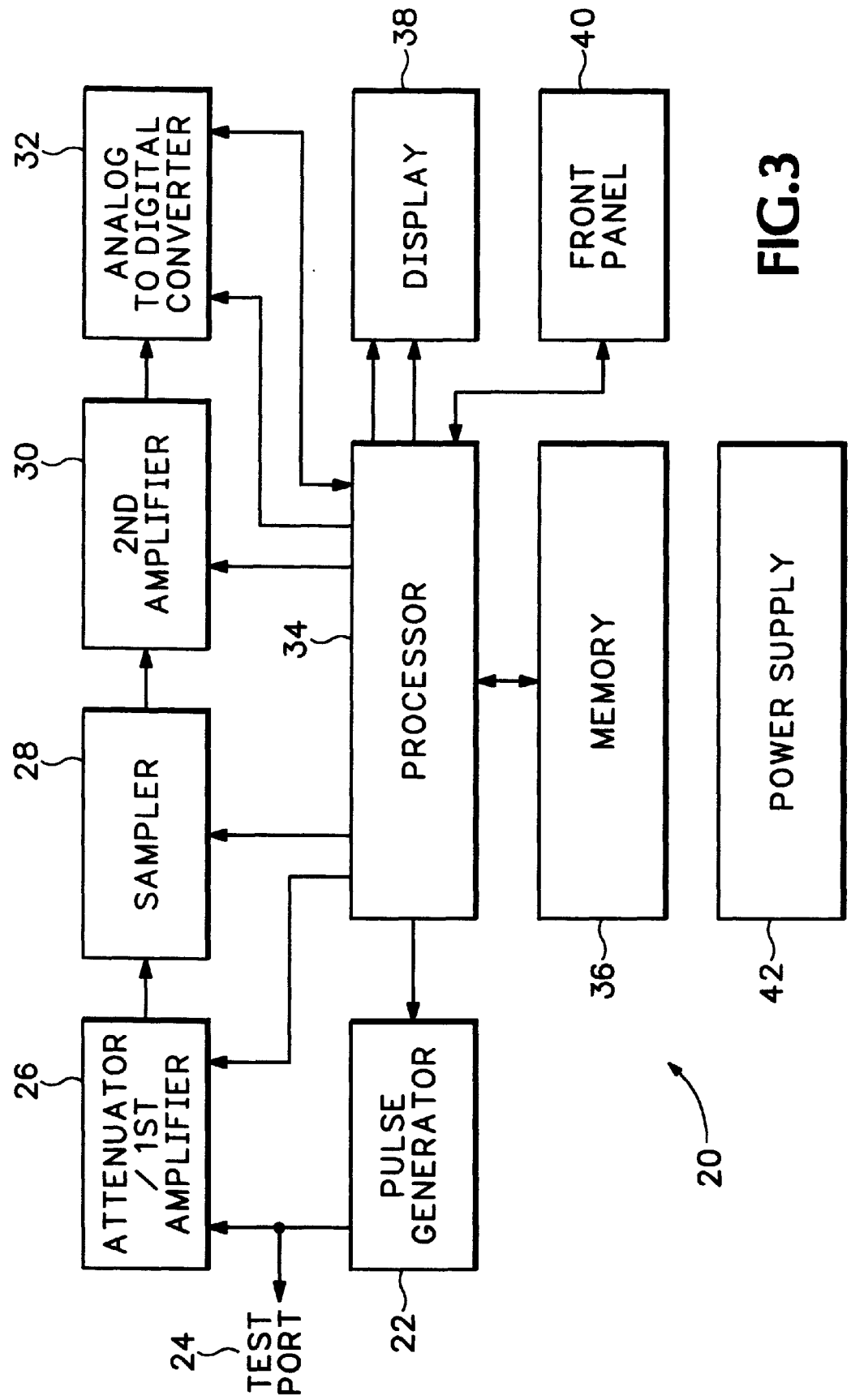
FIG. 3 is a block diagram of an improved time domain reflectometer for reducing line charge in a transmission medium under test according to the present invention.

Referring to FIG. 3 there is shown a block diagram of a time domain reflectometer (TDR) 20 incorporating the improved pulse generator 22 of the present invention. The pulse generator 22 produces interrogating energy pulses that are launched into a transmission medium under test via a test port 24. The transmission medium may be shielded or unshielded twisted pairs, coaxial cables, or other types of metallic transmission mediums. Return signal energy from events in the cable under test representing flaws, discontinuities, or breaks in the cable is coupled to an attenuator/first amplifier 26. The output of the attenuator/first amplifier 26 is coupled to a sampling circuit 28, such as a sample and hold circuit. The sampled analog signal is coupled to a second amplifier 30 for conditioning the sampled signal level to the appropriate level of analog-to-digital converter (ADC) 32. The ADC 32 converts the conditioned analog signal to digital values representative of the magnitude of the analog signal. The digitized values of the sampled analog signal are coupled to microprocessor 34, such as a Motorolla 68330, for processing in the digital domain. The processor stores the digital values in memory 36 that includes flash and DRAM. Memory 36 further includes read only memory (ROM) containing programmed control instructions for controlling the acquisition functions of the TDR 20 and processing instructions for the acquired data from the cable under test. The processor 34, under program control, generates trigger pulses for the pulse generator 22 and sets line charge compensation on or off, controls the attenuation and gain settings of the attenuator/first amplifier 26, the gain of the second amplifier 30, the timing of the sampling circuit 28 and the ADC 32 in relation to the trigger pulses, and the down loading of the ADC 32 digital data. The digital data representing the return signal energy from the cable under test is processed under program control and output to display device 38, such as a cathode-ray-tube, liquid crystal display, or the like. Display processing may be performed by the microprocessor 34 or by a separate display processor (not shown) coupled to receive the processed data from the microprocessor 34. Front panel 40 is coupled to the microprocessor 34 and includes input devices, such as buttons, knobs, soft keys, and the like for initiating examination of the transmission medium and manually setting various TDR 20 parameters, such as the pulsewidth of the interrogating pulses, the instrument gain, sample spacing, measurement range, and the like. Power supply 42 provides operating voltages to the various circuits of the TDR 20.

The commercial embodiment of the time domain reflectometer 20 uses Fast-In/Slow-Out (FISO) technology for the acquisition of the return signal energy. FISO technology described in part in U.S. Pat. No. 5,144,525 combines the attenuator/first amplifier 26, the sampler 28 and the ADC 32 into a integrated circuit chip set under overall program control of the microprocessor 34. The second amplifier 30 is not used in the current implementation of the FISO technology.

Figure 4:
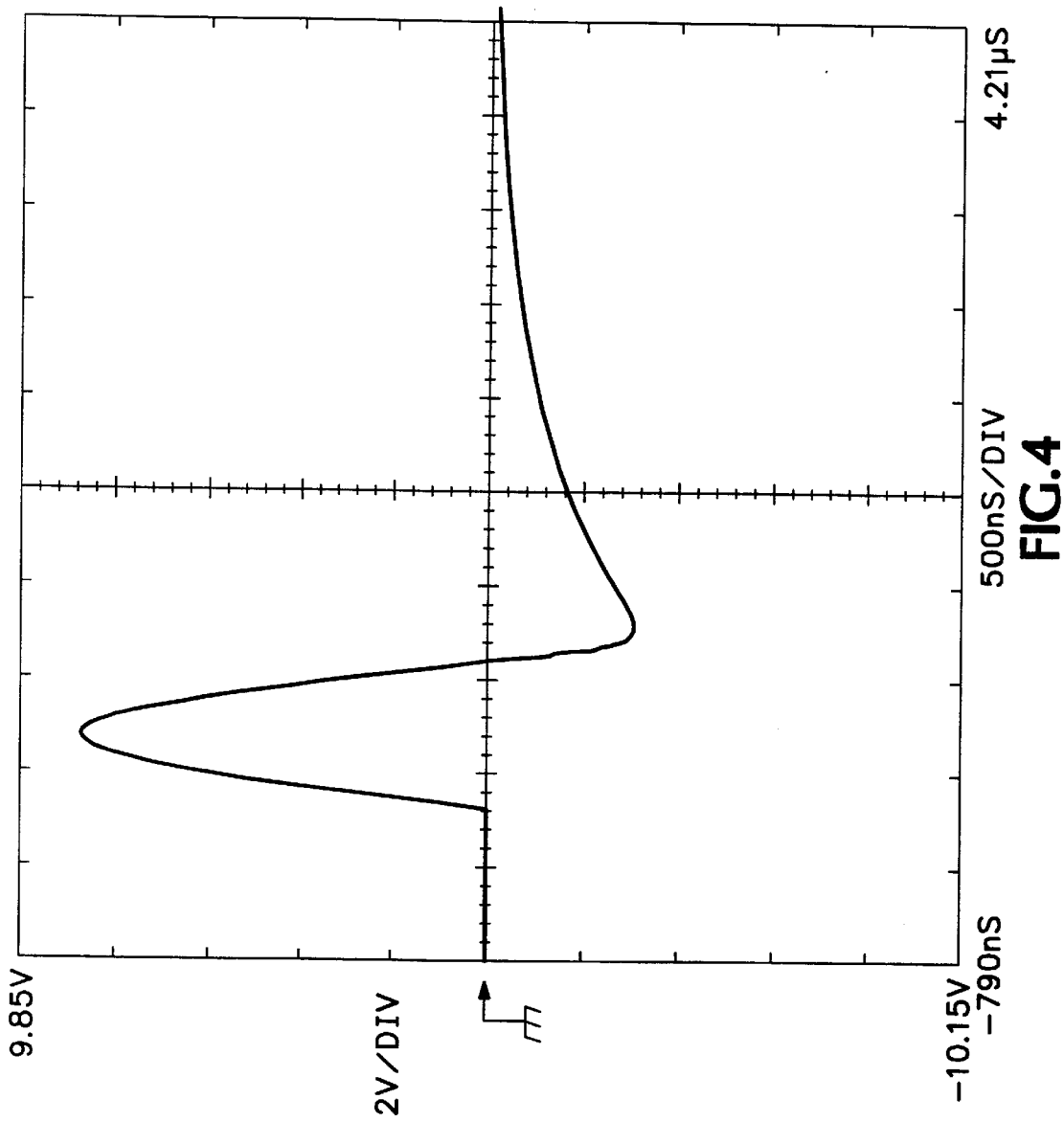
FIG. 4 is a waveform trace of the preferred bipolar interrogating pulse generated by the improved pulse generator in the measurement test instrument according to the present invention.
Figure 5:
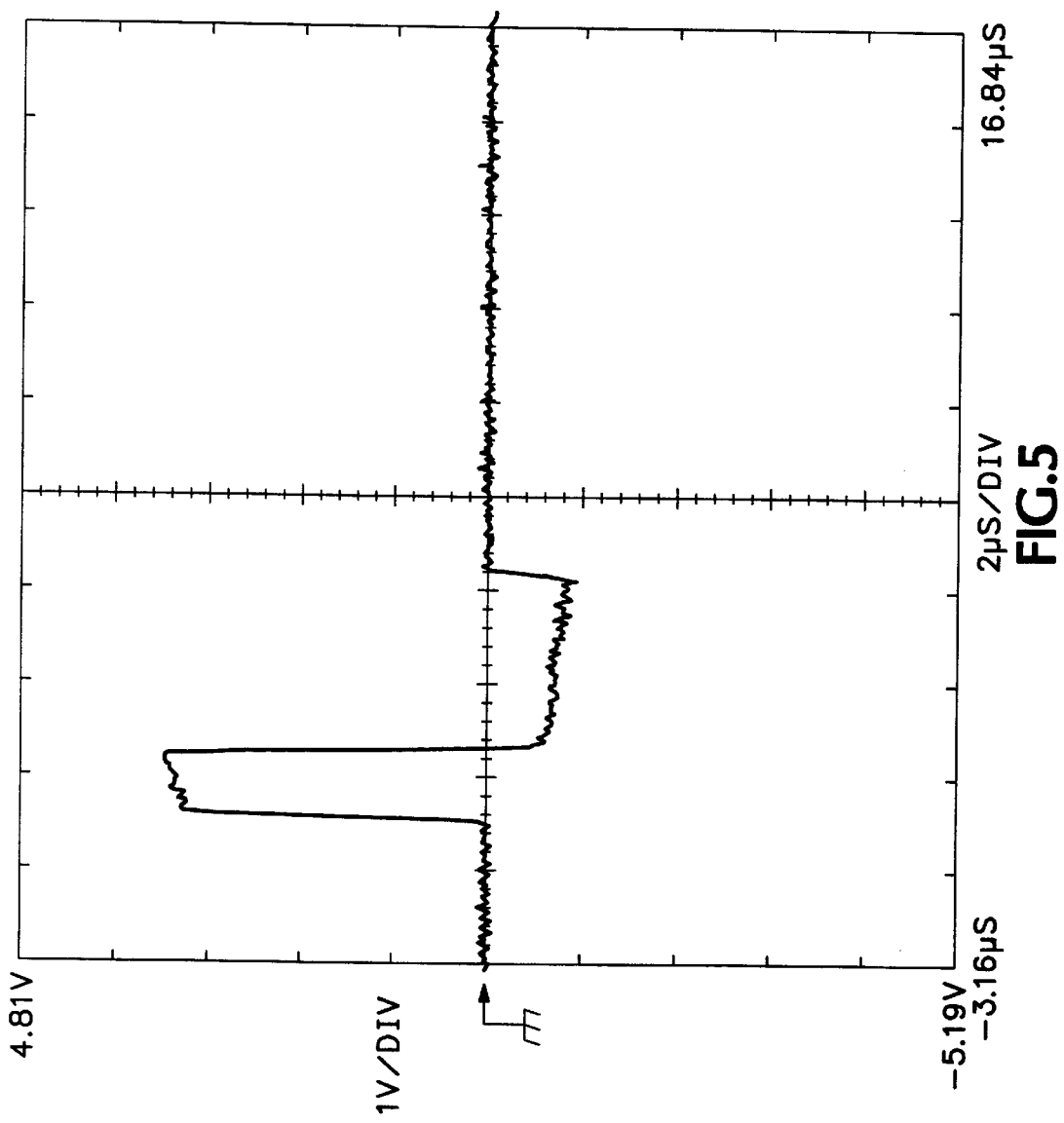
FIG. 5 is a waveform trace of an alternative bipolar interrogating pulse generated by the improved pulse generator in the measurement test instrument according to the present invention.

The improved pulse generator circuit 22 will be described herein below as generating bipolar interrogating pulses having a positive ½ sine wave portion and an exponentially decaying negative portion as shown in waveform trace of FIG. 4. Standard logic level signals having particular transition levels and pulse widths are used in describing the preferred embodiment. These levels and transitions are explanatory and other signal levels and transitions may be used without departing from the scope of the claimed invention. In addition, inverting the bipolar interrogating pulses and generating other bipolar interrogating pulse shapes, such as rectangular shaped positive and negative pulse portions as shown in the waveform trace of FIG. 5, are considered to fall within the scope of the appended claims for the improved pulse generator circuit of the present invention.

Referring to FIG. 6, there is shown a block diagram of the preferred embodiment of the improved pulse generator circuit 22 according to the present invention. The improved pulse generator circuit 22 includes a pulsewidth generator 50, a pulse shaper 52, and a pulse amplifier 54. The pulsewidth generator 50 receives standard logic level trigger pulses from the microprocessor 34 that initiates the generation of falling edge outputs from the pulsewidth generator 50. Circuitry within the pulsewidth generator 50 establishes the time duration of the output pulses and initiates rising edge outputs that define the pulsewidth of the output pulses. Alternately, the microprocessor 34 may directly generate the output pulses equivalent to the output pulses of the pulsewidth generator 50 instead of generating the trigger pulses for the pulsewidth generator 50. In this alternative, the leading edge of the pulses generated by the microprocessor are equivalent of the trigger pulses. The pulse output from the pulsewidth generator 50 is coupled to the pulse shaper circuit 52.

The pulse shaper circuit 52 receives a line charge compensation on/off signal from the microprocessor on the line charge compensation line 56 for setting line charging compensation on or off. The pulse shaper 52 generates a current output in response to the logical low pulses from the pulsewidth generator 50 that produces a ½ sine current signal when the line charge compensation is off and a bipolar current signal having nominal energy at zero frequency when the line charge compensation is on. The pulse amplifier receives the current signal from the pulse shaper 52 and converts the current signal to a voltage signal and amplifies it. In the preferred embodiment the pulse amplifier 54 includes an operational amplifier configured as a current-to-voltage converter and a power booster stage to increase the signal level current to the appropriate levels for interrogating the cable under test. In the preferred embodiment, the output of the current-to-voltage converter is in the range of 20–30 milliamps and the output of the booster stage is in the range of 100 milliamps.

Referring to FIG. 7, there is shown a representative schematic of the pulse shaper circuit 52 of FIG. 6. The pulse shaper circuit 52 includes a resonant LC circuit that includes a capacitor 60 coupled to an inductor 62. The inductor 62 is coupled to the cathode of diode 64 whose anode is coupled to the cathode of a second diode 66. The anode of diode 66 is coupled to the drain of field effect transistor (FET) 68 and to one side of resistor 70. The other side of resistor 70 is coupled to the junction of inductor 62 and diode 64 cathode. The junction of diodes 64 and 66 is coupled to the inverting input of the operational amplifier operating as a current-to-voltage converter in the pulse amplifier 54.

In operation, the microprocessor 34 applies a voltage on the line charge compensation line 56 for controlling the generation of unipolar and bipolar output pulses from the pulse shaper 52. The line charge compensation signal is applied to the gate of FET 68 causing the FET 68 to conduct during unipolar operation for grounding the anode of diode 66 through the gate of FET 68 coupled to ground. Diode 66 is reverse biased during unipolar operation with the anode of diode 66 coupled to ground through FET 68 and the cathode of diode 66 is coupled to the inverting input of the current-to-voltage. The steady state charge on the capacitor 60 is in the range of 5 volts that reverse biases diode 64. The negative going edge from the pulsewidth generator 50 is coupled to capacitor 60 that biases diode 64 into conduction and draws current from the current-to-voltage converter in the pulse amplifier 54. The current through diode 64 flows to ground through FET 68. This produces a ½ sine current at the junction of diodes 64 and 66 that is resonant with the values of capacitor 60 and inductor 62. On the rising edge of the pulsewidth generator output 50, diode 64 is reversed biased and current is no longer drawn from the current-to-voltage converter. With diode 66 reverse biased, the inductor 62 kick-back current is prevented from flowing into the current-to-voltage converter and the output current signal is clamped at the ½ sine pulse. The inductor 62 kick-back current is supplied to FET 68.

Figure 8:
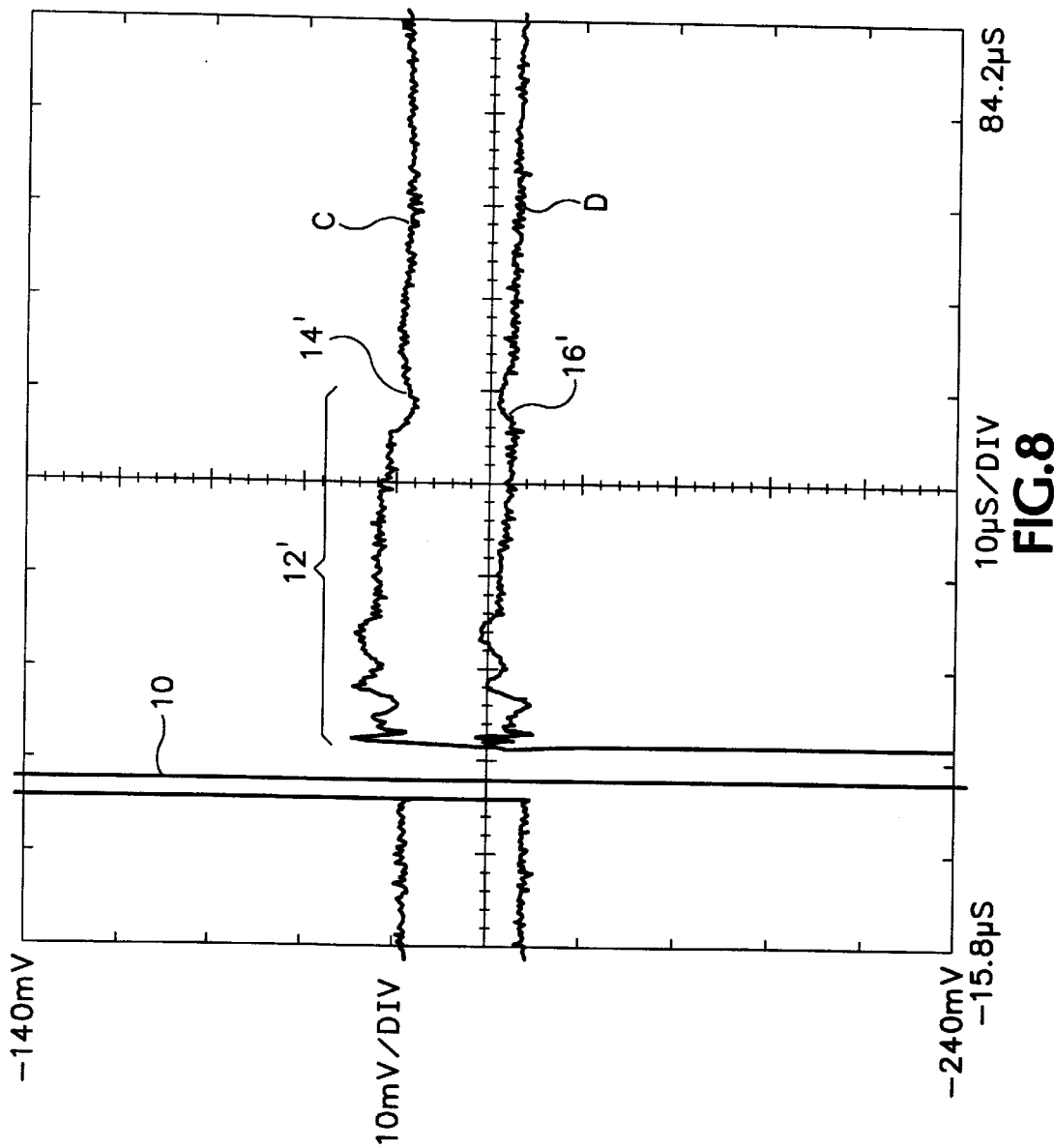
FIG. 8 are waveform traces of return reflections using bipolar interrogating energy pulses where the energy pulses do not produce line charging in the transmission medium.

In bipolar operation, the line charge compensation voltage input from the microprocessor 34 is removed from the gate of FET 68 which ungrounds the anode of diode 66. The steady state condition of the circuit is the same as in unipolar operation with approximately five volts on the capacitor and diodes 64 and 66 in a non-conductive state. As in the unipolar operation, the negative going edge from the pulse generator 50 is coupled to capacitor 60 that biases diode 64 into conduction and draws current from the current-to-voltage converter in the pulse amplifier 54. This produces a ½ sine current at the junction of diodes 64 and 66 that is resonant with the values of capacitor 60 and inductor 62. On the rising edge of the pulsewidth generator output 50, diode 64 is reversed biased and current is no longer drawn from the current-to-voltage converter. With the anode of diode 66 ungrounded, the rising edge forward biases diode 66 and the inductor 62 kick-back current flows into the current-to-voltage converter. Resistor 68 clamps the amplitude of the negative going portion of the bipolar output to produce a positive to negative amplitude ratio of three to one. With the only current path for the kick-back current being into the current-to-voltage converter, the area under the positive ½ sine portion of the pulse equals the area under exponentially decreasing negative portion of the pulse as shown in FIG. 4. The net result is to minimize the energy at DC or zero frequency. FIG. 8. shows overlain waveform traces, C and D, of return signals acquired using the bipolar interrogating pulses as represented in the waveform traces of FIGS. 4 and 5. The bipolar interrogating pulses were launched into the same transmission medium as was the ½ Sine interrogating pulses of FIG. 1. The bipolar interrogating pulses produce the same high amplitude reflective pulse 10' at the instrument/cable under test interface as the ½ Sine pulse.

Figure 2:
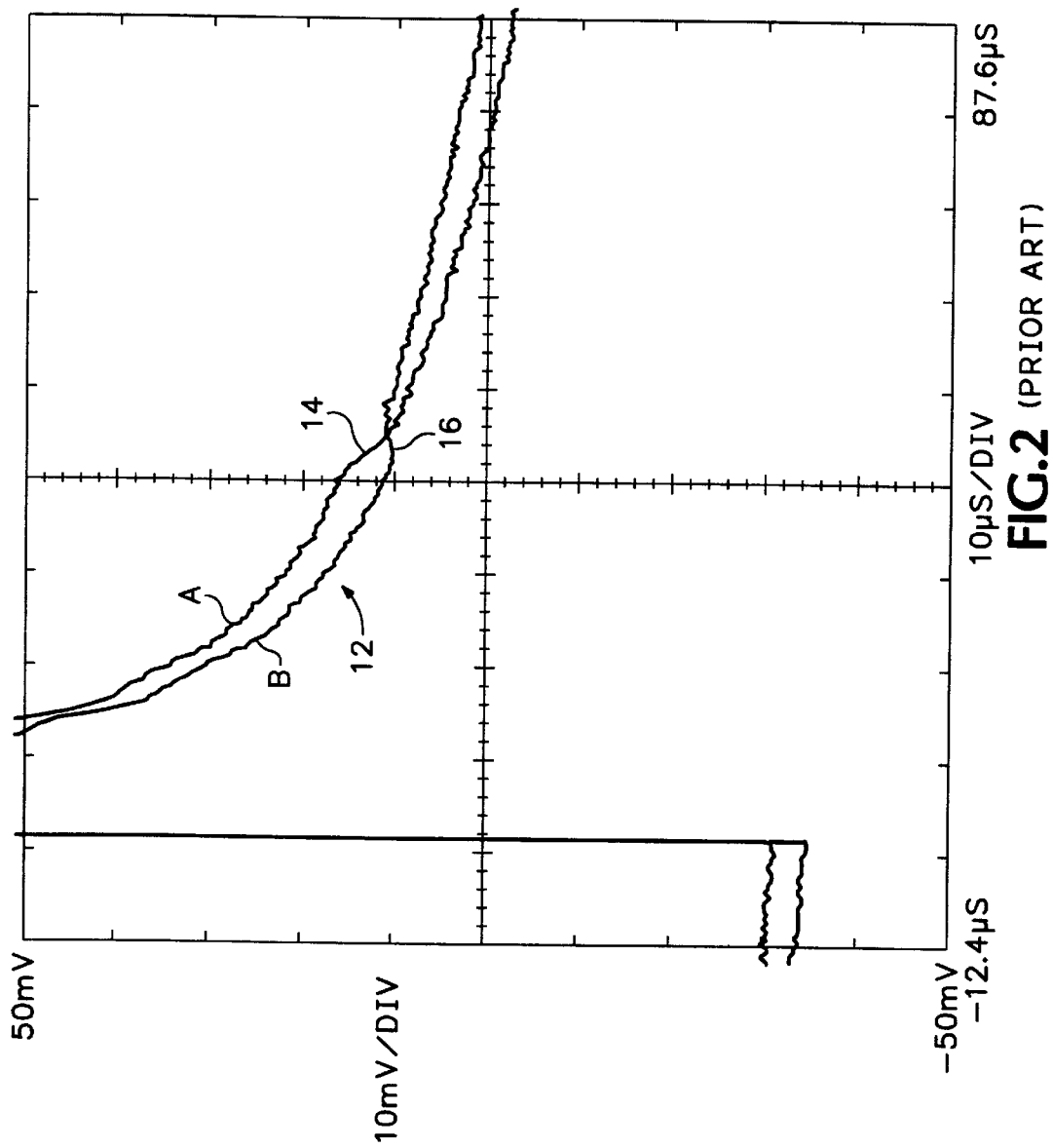
FIG. 2 are waveform traces of return reflections using ½ Sine interrogating energy pulses where the energy pulses produce line charging in the transmission medium.

However, the exponential decay region 12' of the pulse associated with line charging (FIG. 2) is no longer seen due to the bipolar interrogating pulse having essentially zero energy at zero frequency. Events within the former line charge region 12', such as the short in waveform trace C at 14' and the open in waveform trace D at 16', are easily discernable in the trace. Like the waveform traces of FIG. 2, the scale has been increased to show the existence of the shorted and open events.

The positive to negative amplitude ratio of three to one is arbitrary and other ratios ranging from two to one approximately ten to one may be used without departing from the scope of the invention. The ratio used in the current invention reduces distortion in events close to the instrument and aids an operator in determining event location type. A full sine wave interrogating pulse, which falls within the scope of the present invention, produces an up and a down return reflection for a close-in open event and a down and an up for a close-in shorted event. By increasing the positive amplitude over the negative amplitude, the major rising edge of the interrogating waveform is used for assessing an upward displaced event as an open and a downward displaced event as a short. As has been previously described, the bipolar interrogating pulse may be inverted with the ½ sine portion of the interrogating pulse being negative and the exponentially decreasing portion being a positive pulse. The positive to negative ratio would then be reversed with the negative ½ sine portion having the greater amplitude than the positive exponentially decreasing portion.

Figure 9:
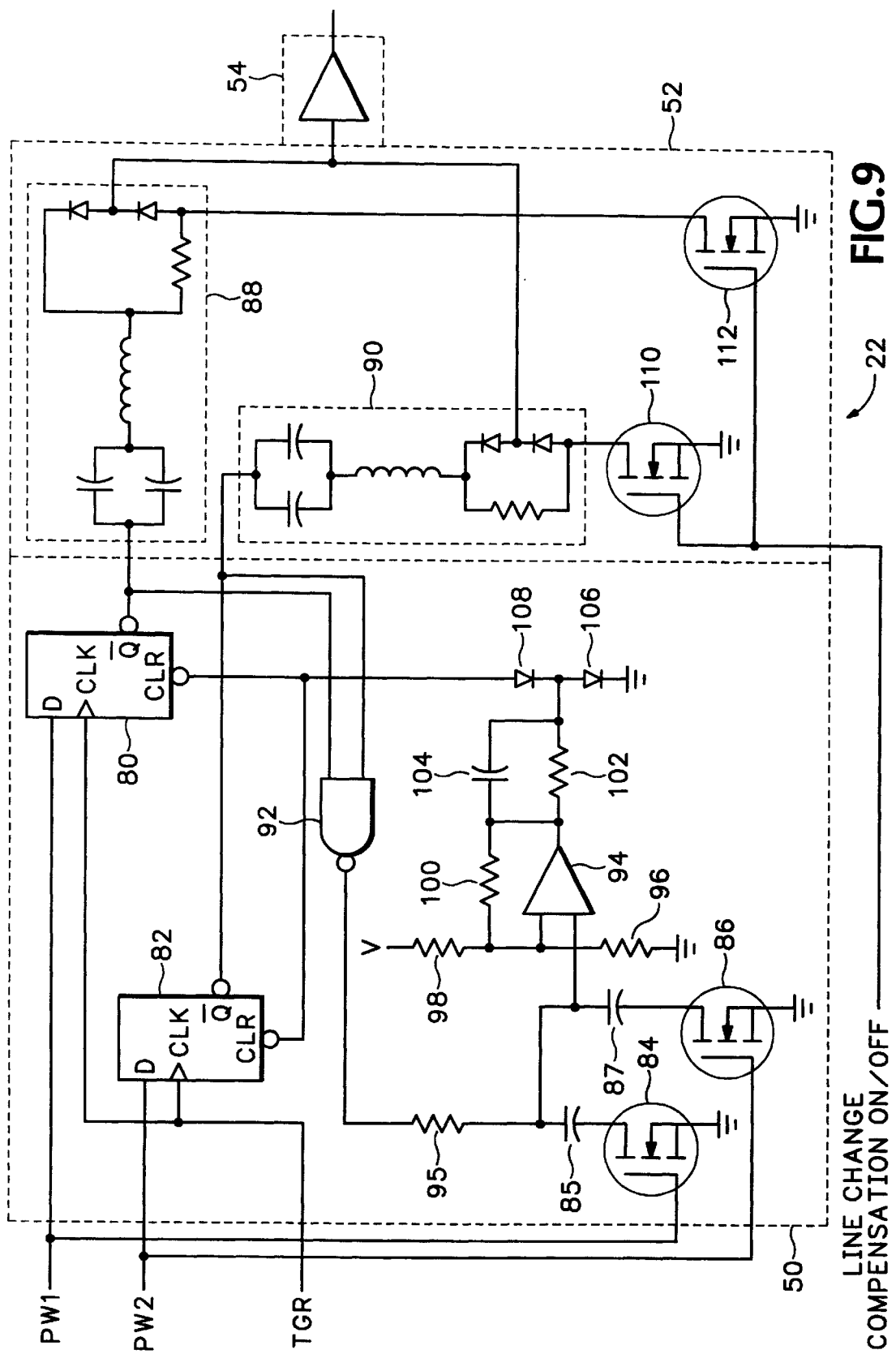
FIG. 9 is a representative schematic diagram of the improved pulse generator for generating multiple pulsewidth bipolar interrogating pulses according to the present invention.

Referring to FIG. 9, there is shown a representative schematic diagram of the improved pulse generator 22 for generating multiple pulsewidth bipolar interrogating pulses. Inputs from the microprocessor 34 include a trigger pulse (TGR), line charge compensation on/off, and pulsewidth 1 (PW1) and pulsewidth 2 (PW2) enable. PW1 and PW2 enables are logical highs that are respectively coupled to the D inputs of D-flip flops 80 and 82 and to the gates of FETs 84 and 86 in pulsewidth generator 50. The drain of FET is coupled to capacitor 85 and the drain of FET 86 is coupled to capacitor 87. The trigger pulse is coupled to the respective clock inputs of flip flops 80 and 82. The $\overline{Q}$ outputs of flip flops 80 and 82 are respectively coupled to first and second pulse shaper circuits 88 and 90 in pulse shaper 52. The $\overline{Q}$ outputs are also coupled to the inputs of NAND gate 92 whose output is coupled to one input of comparator 94 through resistor 95. The other input of comparator 94 is coupled to a voltage divider network that includes resistors 96 and 98 for setting a threshold value for comparator 94. The output of the comparator 94 is coupled to the respective clear (CLR) inputs of flip flops 80 and 82. The comparator 94 also includes a feedback network that includes resistors 100 and 102, capacitor 104 and diodes 106 and 108 for providing some hysteresis for clean edges. The line charge compensation on/off signal from the microprocessor 34 is coupled to the gates of FETs 110 and 112 in pulse shaper circuit 52. The drain of the FET 110 is coupled to the pulse shaper circuit 90 and the drain of FET 112 is coupled to the pulse shaper circuit 88. The respective outputs of the pulse shaper circuits 88 and 90 are coupled to the input of the power amplifier 54 whose output is coupled to the cable under test.

In the quiescent state, the PW1, PW2, and the TGR inputs to the pulse shaper circuit 22 are at logical low levels. The $\overline{Q}$ outputs of flip-flops 80 and 82 are at logical high levels. The application of a logical high on the PW1 input places a logical high on the D input of D flip-flop 80 and biases FET 84 into a conductive state. The application of a rising edge on the TGR input, clocks flip-flops 80 and 82 and generates a negative going edge on the $\overline{Q}$ output of flip-flop 80 that is coupled to the pulse shaping circuit 88. Since PW2 is still at the logical low level, the $\overline{Q}$ output of flip-flop 82 remains at the logical high level. The logical low on the $\overline{Q}$ output of flip-flop 80 is coupled to one of the inputs the NAND gate 92. The NAND gate generates a logical high at its output in response to the change in logic levels at its input causing current to conduct through resistor 95 and charging capacitor 85. The charge on capacitor 85 increases as a function of the RC time constant of resistor 95 and capacitor 85. The voltage on capacitor 85 is coupled on one input of the comparator 94 whose other input is set to the threshold value by the voltage divider network of resistors 96 and 98. Comparator 94 generates a negative going edge in response to the voltage charge on capacitor 85 crossing the threshold value. The negative output of the comparator is coupled to the clear (CLR) input of flip-flops 80 and 82 which resets the $\overline{Q}$ output to the previous level producing a positive going edge on the $\overline{Q}$ output of flip-flop 80. The pulse output of the pulsewidth generator 50 is initiated by the trigger pulse (TGR) and ends with the generation of the reset pulse by the comparator 94.

Generating a pulse output from pulsewidth generator 50 using the PW2 input is similar in operation as with PW1 with the exception that the PW2 input is applied to the D input of flip-flop 82 and FET 86 is biased into conduction. In addition, the $\overline{Q}$ output of flip-flop 82 is coupled to the pulse shaper circuit 90. Further, the RC time constant of resistor 95 and capacitor 87 is different from the RC time constant of resistor 95 and capacitor 85 producing a different pulsewidth output from pulsewidth generating circuit 50. In the preferred embodiment, the RC time constant associated with the PW1 input generates a output from the pulse generator 22 having a pulsewidth of 340 nanoseconds. The RC time constant associated with the PW2 input generates an output from the pulse generator 22 having a pulsewidth of 3400 nanoseconds. It should also be noted that either PW1 or PW2 will be a logical high at any one time for generating an output from the pulsewidth generator 50.

An improved pulse generator has been described for use in a measurement test instrument for generating bipolar interrogating energy pulses for characterizing metallic transmission mediums having a pulse shaper circuit that receives binary pulse inputs and generates bipolar pulses having reduced or no energy at zero frequency. The pulse shaper circuit receives a line charge compensation on/off signal from an instrument controller for generating both ½ Sine pulses and the bipolar pulses. The bipolar and the ½ Sine pulses are coupled to a pulse amplifier that has an operational amplifier operating as a current-to voltage converter and a power booster for increasing the current output of the interrogating energy pulse. The pulse generator has further been described with a pulsewidth generator circuit for generating the binary pulse inputs to the pulse shaper circuit. The pulsewidth generator may include circuitry for generating differing binary pulse input pulsewidths that are respectively coupled to separate pulse shaper circuits having resonant LC circuits tuned to the pulsewidth the binary input pulses.

It will be obvious to those having skill in the art that many changes may be made to the details of the above-described embodiments of this invention without departing from the underlying principles thereof The scope of the present invention should, therefore, be determined only by the following claims.

What is claimed is:

1. An improved pulse generator circuit for use in a measurement test instrument that launches interrogating pulses into a transmission medium for acquiring data representative of return reflections from the transmission medium wherein the improvement comprises a pulse shaper circuit receiving an input signal for generating a non-symmetric bipolar output signal for characterizing impedances in the transmission medium with the non-symmetric bipolar output signal having minimal energy at zero frequency for producing interrogating pulses having reduced line charging effects on the transmission medium.

2. The improved pulse generator circuit as recited in claim 1 wherein the pulse shaper circuit further comprises:
    a resonant LC circuit receiving an input pulse having a leading transition and a trailing transition for generating a sine wave current output having a positive magnitude one-half sine portion and a negative magnitude one-half sine portion; and
    a diode-resistor network coupled to the resonant LC circuit for clamping the magnitude of one of the one-half sine wave portions for producing a exponentially decreasing output portion.

3. The improved pulse generator circuit as recited in claim 2 wherein the diode-resistor network clamps the sine wave current output magnitudes at a ratio of three-to-one.

4. The improved pulse generator circuit as recited in claim 2 wherein the pulse shaper circuit further comprising a means coupled to the diode-resistor network for applying a ground to the pulse shaper circuit during unipolar operation and removing the ground during bipolar operation.

5. The improved pulse generator circuit as recited in claim 4 wherein the grounding means is an electronic switch.

6. The improved pulse generator circuit as recited in claim 5 wherein the electronic switch is a field-effect transistor having a drain coupled to the diode-resistor network, a source coupled to ground, and a gate coupled to receive an input signal for causing the field-effect-transistor to conduct and couple the diode-resistor network to ground.

7. A pulse shaping circuit for use in a pulse generator for producing interrogating energy pulses in a measurement test instrument that are launched into a transmission medium for acquiring data representative of return reflections from the transmission medium comprising:
    a resonant LC circuit receiving an input pulse having a leading transition and a trailing transition for generating a sine wave current output having a positive magnitude one half sine portion and a negative magnitude one-half sine portion; and
    a diode-resistor network coupled to the resonant LC circuit for clamping the magnitude of one of the one-half sine wave portions for generating an exponentially decreasing output that produces a non-symmetric bipolar output signal for characterizing impedances in the transmission medium with the non-symmetric bipolar output signal having minimal energy at zero frequency for reducing line charging effects on the transmission medium.

8. The pulse shaping circuit as recited in claim 7 wherein the diode-resistor network clamps the sine wave current output magnitudes at a ratio of three-to-one.

9. The pulse shaping circuit as recited in claim 7 further comprising a means coupled to the diode-resistor network for applying a ground to the pulse shaper circuit during unipolar operation and removing the ground during bipolar operation.

10. The pulse shaper circuit as recited in claim 9 wherein the grounding means is an electronic switch.

11. The pulse shaper circuit as recited in claim 10 wherein the electronic switch is a field-effect transistor having a drain coupled to the diode-resistor network, a source coupled to ground, and a gate coupled to receive an input signal for causing the field-effect-transistor to conduct and couple the diode-resistor network to ground.

12. An improved pulse generator circuit for use in a measurement test instrument that launches interrogating pulses into a transmission medium for acquiring data representative of return reflections from the transmission medium comprising:

a pulsewidth generator for generating an output pulse having a leading transition and a trailing transition;

a pulse shaper circuit receiving the output pulse from the pulsewidth generator for generating a non-symmetric bipolar output signal for characterizing impedances in a transmission medium with the non-symmetric bipolar output signal having minimal energy at zero frequency for producing interrogating pulses having reduced line charging effects on the transmission medium; and an amplifier coupled to receive the output from the pulse shaper circuit for generating an amplified output signal for launching into the transmission medium.

13. The improved pulse generator circuit as recited in claim 12 wherein the pulsewidth generator circuit further comprises:

a latch for generating an output pulse having a leading transition generated in response to a pulsewidth enable signal and a clock input signal and a trailing transition generated in response to a clear input signal; and a comparator circuit having a first input coupled to receive a threshold value and a second input coupled to receive an input signal responsive to the leading transition of the latch output for generating the clear input signal to the latch when the input signal to the comparator exceeds the threshold value.

14. The improved pulse generator circuit as recited in claim 13 wherein the comparator circuit further comprises an RC circuit coupled to the second input of the comparator circuit for generating an increasing voltage signal in response to the leading transition of the latch output.

15. The improved pulse generator circuit as recited in claim 13 wherein the pulsewidth generator further comprises:

a plurality of latches with each latch receiving individual pulsewidth enable signals for generating individual output pulses in response to a common clock signal;

a logic circuit coupled to receive the outputs from the plurality of latches for generating an output signal in response to a leading edge transition from any of the latches;

a plurality of RC circuits coupled to the second input of the comparator circuit for generating an increasing voltage signal in response to the output signal from the logic circuit with each RC circuit having a time constant defining a pulsewidth for a particular latch; and means for enabling each of the respective RC circuits in response to the individual pulsewidth enable signals.

16. The improved pulse generator circuit as recited in claim 15 wherein the pulse generator further comprises a plurality of pulse shaper circuits with each pulse shaper circuit receiving the output pulse from the one of the plurality of latches.

17. An improved measurement test instrument launching interrogating pulses into a transmission medium for acquiring data representative of return reflections from the transmission medium, the improvement comprising a pulse generator that generates non-symmetric bipolar interrogating pulses for characterizing impedances in a transmission medium with the non-symmetric bipolar pulses having minimal energy at zero frequency for reducing line charging produced by the launched interrogating pulses.

18. The improved measurement test instrument as recited in claim 17 wherein the pulse generator further comprises a variable pulse generator for generating interrogating pulses having amplitudes and pulsewidths optimized for viewing parameters using unipolar pulses for shorter transmission medium lengths and the bipolar pulses for the longer transmission medium lengths.

19. The improved measurement test instrument as recited in claim 17 further comprising means for displaying the acquired data representative of the return reflections from the transmission medium.

20. An improved method for characterizing impedance in a transmission medium by launching interrogating pulses into the transmission medium for acquiring and displaying data representative of return reflections from the transmission medium wherein the improved step comprises generating interrogating non-symmetric bipolar pulses having minimal energy at zero frequency for reducing line charging produced by the launched interrogating pulses.

21. The improved method for characterizing impedance in a transmission medium as recited in claim 20 wherein the improved pulse generating step further comprises the steps of generating interrogating pulses having amplitudes and pulsewidths optimized for viewing parameters using unipolar pulses for shorter transmission medium lengths and generating interrogating pulses having amplitudes and pulsewidths optimized for viewing parameters using the bipolar pulses for the longer transmission medium lengths.

* * * * *